(12) United States Patent
Lee et al.

(10) Patent No.: US 11,491,775 B1
(45) Date of Patent: Nov. 8, 2022

(54) SOLAR MODULE EXTERIOR DISASSEMBLING APPARATUS

(71) Applicant: Won Kwang S&T Co., Ltd., Incheon (KR)

(72) Inventors: Sang Hun Lee, Incheon (KR); Jun Kee Kim, Seoul (KR); Tae Eun Lee, Incheon (KR); Cheong Min Noh, Incheon (KR); Geun Sik Cho, Incheon (KR); Su Hyon Eom, Incheon (KR); Je Gu An, Gyeonggi-do (KR); Dong Hwan Kim, Incheon (KR); Beom Gyu Oh, Incheon (KR)

(73) Assignee: Won Kwang S&T Co., Ltd., Incheon (KR)

( * ) Notice: Subject to any disclaimer, the term of this patent is extended or adjusted under 35 U.S.C. 154(b) by 0 days.

(21) Appl. No.: 17/519,700

(22) Filed: Nov. 5, 2021

(30) Foreign Application Priority Data

Aug. 10, 2021 (KR) .......................... 10-2021-0105655

(51) Int. Cl.
*B32B 43/00* (2006.01)
*H01L 31/18* (2006.01)
*H02S 30/10* (2014.01)

(52) U.S. Cl.
CPC ............ *B32B 43/006* (2013.01); *H01L 31/18* (2013.01); *H02S 30/10* (2014.12); *B32B 2457/12* (2013.01); *Y10S 156/924* (2013.01); *Y10S 156/937* (2013.01); *Y10T 156/1168* (2015.01);
(Continued)

(58) Field of Classification Search
CPC ............ B32B 43/006; Y10T 156/1168; Y10T 156/1184; Y10T 156/1961; Y10T 156/1967; Y10S 156/924; Y10S 156/937
See application file for complete search history.

(56) References Cited

U.S. PATENT DOCUMENTS

2017/0266947 A1* 9/2017 Tateyama .............. G02F 1/1333

FOREIGN PATENT DOCUMENTS

| KR | 10-1622345 B1 | 5/2016 |
| KR | 10-2037120 B1 | 10/2019 |
| KR | 10-2020-0034100 A | 3/2020 |

(Continued)

OTHER PUBLICATIONS

KR 10-2037120 spec translation (Year: 2018).*

*Primary Examiner* — Philip C Tucker
*Assistant Examiner* — Nickolas R Harm
(74) *Attorney, Agent, or Firm* — The PL Law Group, PLLC (57) ABSTRACT

A solar module exterior disassembling apparatus for disassembling an exterior of a solar module including a module body, a frame and a junction box attached to the module body includes a positioning plate supporting one surface of the module body from below the solar module and being able to move up and down, a top contact plate over the positioning plate and in contact with the other surface of the module body when the positioning plate is moved up, frame separation blades around the top contact plate and moving in parallel with a surface of the module body between a first position inside the frame and a second position outside the frame, and a pressing actuator including pressing cylinders and pressing outward from the module body and disassembling the module body by moving forward the frame separation blades from the first position to the second position with the pressing cylinders.

9 Claims, 10 Drawing Sheets

(52) U.S. Cl.
CPC .... *Y10T 156/1184* (2015.01); *Y10T 156/1961* (2015.01); *Y10T 156/1967* (2015.01)

(56) References Cited

FOREIGN PATENT DOCUMENTS

| | | |
|---|---|---|
| KR | 10-2081776 B1 | 4/2020 |
| KR | 10-2154030 B1 | 9/2020 |
| KR | 10-2176239 B1 | 11/2020 |
| KR | 10-2020-0142457 A | 12/2020 |
| KR | 10-2185429 B1 | 12/2020 |
| KR | 10-2021-0083721 A | 7/2021 |

* cited by examiner

SOLAR MODULE EXTERIOR DISASSEMBLING APPARATUS

CROSS-REFERENCE TO RELATED APPLICATION(S)

This application claims the benefit under 35 USC § 119(a) of Korean Patent Application No. 10-2021-015655, filed on Aug. 10, 2021, in the Korean Intellectual Property Office, the entire disclosure of which is incorporated herein by reference for all purposes.

BACKGROUND

1. Field of the Invention

The present disclosure relates to a solar module exterior (exterior structures such as a frame and a junction box) disassembling apparatus and, more particularly, to a solar module exterior disassembling apparatus that can conveniently and safely disassemble a frame of a solar module and can also simultaneously disassemble a frame and a junction box.

2. Description of the Related Art

This invention was made with government support under National Research and Development program of South Korea (Project identification No. 1485017207; Project Serial No. 2020003100003; Research Administration Authority: Korea Environmental Industry & Technology Institute (KEITI); Research Program Title: R&D Project for recyclability of non-recyclable products; Research Project Title: Development of technology for collecting, shattering and recycling-recovery of valuable materials from end of life photovoltaic panel; Contribution Rate: 100%; Project Performing Agency Name: WonKwang S&T Co., Ltd.; Period of Research: May 21, 2020 to Dec. 31, 2022) awarded by Korea Ministry of Environment (MOE).

The development of clean energy that reduces environment pollution is being accelerated. Development of clean energy is in progress in various ways including national support projects. Clean energy technology variously includes not only a technology of managing produced power such as energy management, delivery, and storage, but a renewable energy technology that uses biomass, etc. Solar photovoltaic power generation, wind power generation, etc. that generate power using natural force without using the fossil fuel have been continuously studied as power production technologies.

In particular, solar photovoltaic power generation has been remarkably improved in power generation efficiency through continuous improvement of the technology since development, and accordingly, it is considered as a spotlighted alternative energy technology even at present. Solar photovoltaic power generation facilities are continuously increasing because there is the advantage that they can be easily applied even to places where conventional power generation facilities, etc. are difficult to install, they hardly cause environmental damage, and it is possible to use existing buildings, facilities, etc. when installing them.

However, a solar photovoltaic power generation facility also has a problem with maintenance because a solar cell has to be replaced and discarded when its lifespan is ended. In particular, as not only the number, but the application unit or area of solar photovoltaic power generation facilities are increased, it is required to replace and discard solar cells in large quantities. However, most solar photovoltaic power generation facilities are aggregate of photovoltaic modules formed by combining a solar cell in a frame. Further, since photovoltaic modules have a structure in which a glass plate, etc. are stacked, they are difficult to simply discard, which is a considerable problem in management of solar photovoltaic power generation facilities in a large scale.

For example, it may be required to separate first an interior panel including solar cells (an interior structure having a film type stack including a glass plate and solar cells stacked on the glass plate) from the exterior such as a frame when discarding a solar module. Further, when there are other exteriors (a junction box, etc.), it may be required to first remove the structures as well. If this work is not well completed, not only problems occur in the following processes, but also the entire process of discarding the solar module becomes complicated and retarded, so there is a need for an appropriate measure.

SUMMARY

An objective of the present disclosure is to provide a solar module exterior disassembling apparatus that can easily disassemble the exterior of a solar module, and particularly, to provide a solar module exterior disassembling apparatus that can more conveniently and safely disassemble a frame of a solar module and can also simultaneously disassemble the frame and a junction box.

The object of the present disclosure is not limited to those described above and other objects may be made apparent to those skilled in the art from the following description.

The present disclosure provides a solar module exterior disassembling apparatus for disassembling an exterior of a solar module in which a plate-shaped module body, which is comprised of a glass plate and a film stack including solar cells stacked on the glass plate, and the exterior, which includes a frame surrounding the edge of the module body and a junction box attached to and protruding from the outer surface of the film stack, are coupled. The solar cell exterior disassembling apparatus includes: a positioning plate supporting one surface of the module body from below the solar module and being able to move up and down; a top contact plate disposed to face the positioning plate over the positioning plate and coming in contact with the other surface of the module body when the positioning plate is moved up; a plurality of frame separation blades disposed around the top contact plate and moving in parallel with a surface of the module body between a first position inside the frame and a second position outside the frame; and a pressing actuator including a plurality of pressing cylinders and pressing outward from the module body and disassembling the module body by moving forward the frame separation blades from the first position to the second position with the pressing cylinders.

The apparatus may further include a junction box separation blade disposed on any one of the frame separation blades and formed by moving rearward a portion of the frame separation blade.

The apparatus may further include a connection wall fixing the junction box separation blade behind the frame separation blade.

The apparatus may further include a junction box disassembling groove surrounded and closed by the junction box separation blade and the connection wall with the front thereof open to retain the junction box therein.

The apparatus may further include a gripper including movable claw coupled to the frame separation blade and holding and bringing the frame in contact with the frame separation blade.

The movable claw may be coupled at an end to a shaft fixed to the frame separation blade, so the movable claw can be folded or unfolded by rotating about the shaft.

The gripper may include: a sensor unit sensing the frame at a side of the frame separation blade and generating a sensing signal; and an operation cylinder spaced apart from the shaft, coupled to a hinge shaft disposed at the movable claw, and driving the movable claw by pushing or pulling the hinge shaft using fluid pressure in response to a sensing signal.

The apparatus may further include upper columns perpendicularly connected to the top surface of the top contact plate and supporting pressure applied downward to the top contact plate from above.

The frame separation blades may be disposed in parallel with the sides of the frame, respectively, and the pressing cylinders may be perpendicularly connected to the frame separation blades, respectively.

The apparatus may further include a head surrounding and coupled to a piston of the pressing cylinder and a connection block protruding from a side of the head and having a fixing plate fixing the frame separation blade to the head, in which the fixing plate may be positioned behind the end of the piston in the longitudinal direction of the piston, whereby the frame separation blade is positioned further inside than the end of the piston.

DETAILED DESCRIPTION

The advantages and features of the present disclosure, and methods of achieving them will be clear by referring to the exemplary embodiments that will be described hereafter in detail with reference to the accompanying drawings.

However, the present disclosure is not limited to the exemplary embodiments described hereafter and may be implemented in various ways, and the exemplary embodiments are provided to complete the description of the present disclosure and let those skilled in the art completely know the scope of the present disclosure and the present disclosure is defined by claims. Like reference numerals indicate the same components throughout the specification.

Hereafter, a solar module exterior disassembling apparatus according to the present disclosure is described in detail with reference to FIGS. 1 to 10. An embodiment of the present disclosure is described first in detail with reference to FIGS. 1 to 6 and then other embodiments of the present disclosure are described in detail with reference to FIGS. 7 to 10.

Figure 1:
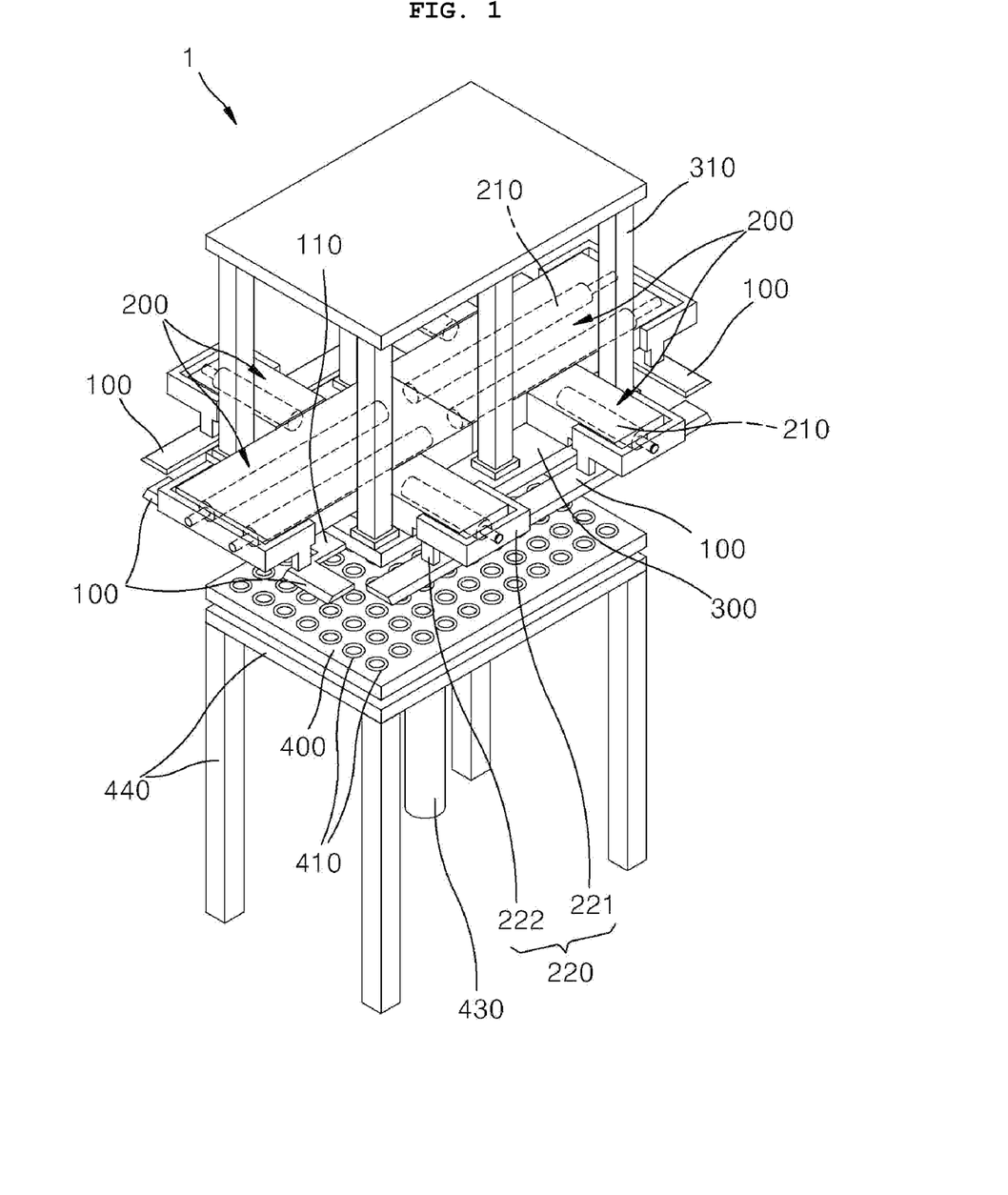
FIG. 1 is a perspective view of a solar module exterior disassembling apparatus according to an embodiment of the present disclosure.
Figure 2:
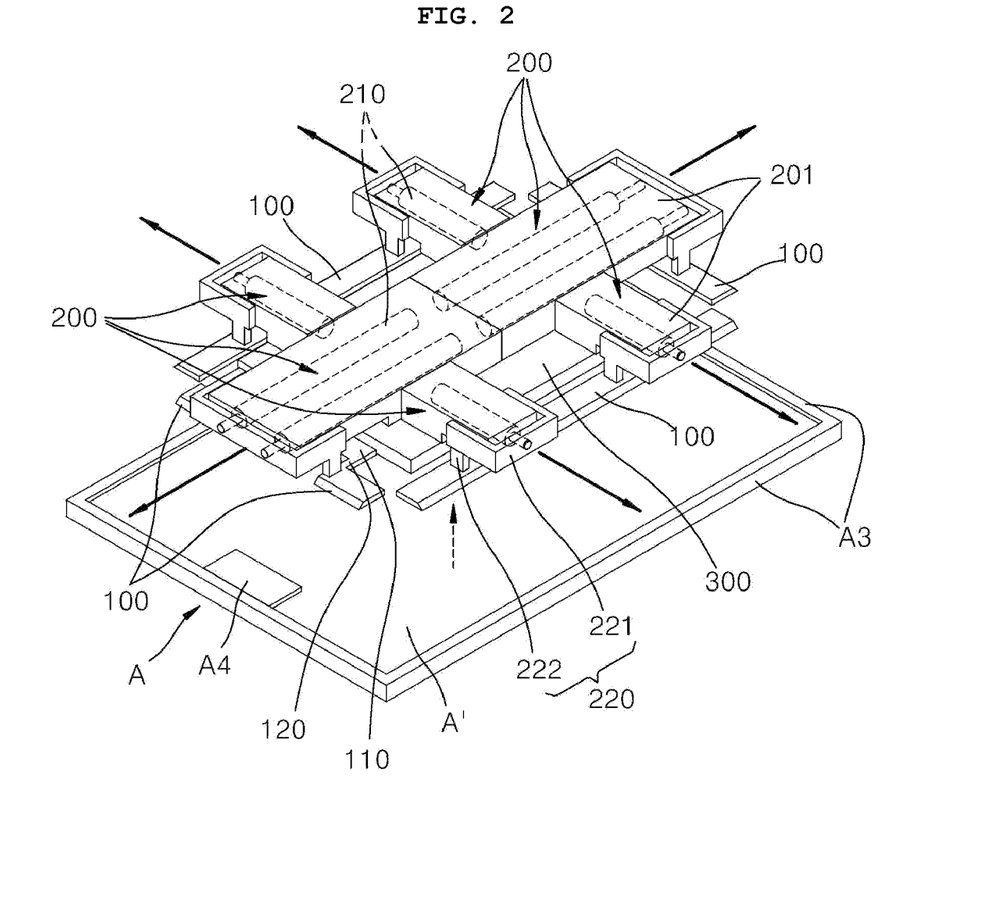
FIG. 2 is a view showing a frame separation blade and a pressing actuator of the solar module exterior disassembling apparatus of FIG. 1 together with a solar module.

FIG. 1 is a perspective view of a solar module exterior disassembling apparatus according to an embodiment of the present disclosure, and FIG. 2 is a view showing a frame separation blade and a pressing actuator of the solar module exterior disassembling apparatus of FIG. 1 together with a solar module.

Referring to FIGS. 1 and 2, a solar module exterior disassembling apparatus 1 according to the present disclosure disassembles a frame of a solar module by straightly driving a plurality of frame separation blades 100 (see FIG. 2). The frame separation blades 100 are disposed around a top contact plate 300 and a positioning plate (see 400 in FIG. 1) under the top contact plate 300 moves up, thereby bringing the interior structure of a frame A3 (module body A') of a solar module (see A in FIG. 2) in contact with the top contact plate 300. Accordingly, only the interior structure of the frame A3 is fixed between the top contact plate 300 and the positioning plate 400, and the frame A3 can be relatively moved. Accordingly, it is possible to press and easily separate the frame A3 with the frame separation blades 100.

A junction box separation blade (see 110 in FIG. 2) for removing a junction box A4 of the solar module may be disposed on at least one of the frame separation blades 100. The position of the junction box separation blade 110 is specifically adjusted with respect to the frame separation blades 100, so the junction box separation blade 110 can remove the junction box A4 while simultaneously moving with the frame separation blades 100. Accordingly, it is possible to simultaneously disassemble the frame A3 and the junction box A4 that are the external parts of the solar module through one-time disassembling operation, so it is possible to remarkably simplify the process.

The solar module exterior disassembling apparatus 1 of the present disclosure is configured as follows. The solar module exterior disassembling apparatus 1 for disassembling the exterior of a solar module (see A in FIG. 2) in which a plate-shaped module body (see A' in FIG. 2), which is comprised of a glass plate and a film stack including solar cells stacked on the glass plate, and the exterior, which includes a frame (see A3 in FIG. 2) surrounding the edge of the module body and a junction box (see A4 in FIG. 2) attached to and protruding from the outer surface of the film stack, are coupled, includes: a positioning plate 400 supporting one surface of the module body from below the solar module and being able to move up and down; a top contact plate 300 disposed to face the positioning plate 400 over the positioning plate 400 and coming in contact with the other surface of the module body when the positioning plate 400 is moved up; a plurality of frame separation blades 100 disposed around the top contact plate 300 and moving in parallel with a surface of the module body between a first position inside the frame and a second position outside the frame; and a pressing actuator including a plurality of pressing cylinders 210 and pressing outward from the module body and disassembling the module body by moving forward the frame separation blades 100 from the first position to the second position with the pressing cylinders 210.

In an embodiment of the present disclosure, the solar module exterior disassembling apparatus 1 further includes a junction box separation blade (see 110 in FIG. 2) disposed on at least any one of the frame separation blades 100 and formed by moving backward a portion of the frame separation blade 100, and further includes a connection wall (see 120 in FIG. 2) moving backward and fixing the junction box separation blade 110 from the frame separation blade 100, and a junction box disassembling groove (see 101 in FIG. 4) surrounded and closed by the junction box separation blade 110 and the connection wall 120 with the front open to retain a junction box therein. This configuration can, particularly, disassemble an exterior comprised of a frame and a junction box of a solar module at a time. The configuration, operation effect, etc. of the present disclosure are described hereafter in more detail on the basis of the embodiment of the present disclosure.

First, the solar module A and the exterior of the solar module that is the application target of the present disclosure are described with reference to FIG. 2. The solar module A may be formed by integrating a plurality of solar cells and may include a protector for integrating and protecting the solar cells. The solar module A includes an interior structure disposed in a panel shape inside a frame A3, the frame A3 surrounding the interior structure, and a junction box A4 protruding from a surface of the interior structure. The solar cells are included in the interior structure, and the frame A3 and the junction boxy A4 are exterior structures and correspond to the exterior of the solar module A stated in the present disclosure. The interior structure forms a plate-shaped module body A' and the module body A' includes a glass plate (see A1 in FIG. 5) and a film stack (see A2 in FIG. 5) including solar cells stacked on the glass plate A1. The interior structure of the solar module is the same as the module body A' in the specification. The frame A3 serves to surround and protect the edge of the module body A' and may be a metallic structure such as an aluminum bar. The glass plate A1 of the module body A', which is disposed on the front surface (i.e., a light-incident surface) of the solar module A in actual use, can serve to prevent the film stack A2 from being contaminated and maintain the shape of the film stack A2. The solar cells may be included in the film stack A2 and the film stack A2 may include, in addition to the solar cells, an encapsulation film, a back sheet, etc. that are disposed on both sides of the solar cells. The junction box A4 is a box-shaped structure disposed on the outer surface (i.e., the rear surface opposite the light-incident surface) of the film stack A2 and used for cable connection, etc.

Referring to FIG. 1, the positioning plate 400 supports the solar module from below the solar module. The positioning plate 400 supports one surface of the module body (see A' in FIG. 2) of the solar module from below the solar module and can move up and down. Referring to FIG. 2, the solar module A is disposed with the rear surface, on which the junction box A4 is positioned, up, and is mounted on the positioning plate 400 in this state. Accordingly, the surface supported by the positioning plate 400 is the surface on which the glass plate of the module body A' is disposed and is the front surface (i.e., the light-incident surface) of the solar module. The positioning plate 400 may be coupled to a base 440 to be movable up and down, and the base may be various shapes of supporting structures that are supported on the ground. These supporting structures may be formed in various types, for example a type including a plurality of legs. For example, a lifting cylinder 430 that stretches and contracts up and down may be coupled between the base 440 and the positioning plate 400, and the positioning plate 400 can be moved up and down by the lifting cylinder 430. However, the present disclosure is not limited to the lifting cylinder 430 and may use other structures that can move up and down the positioning plate 400.

A plurality of elastic portions 410 protruding upward may be formed on the top surface of the positioning plate 400 (i.e., the surface that comes in contact with the module body of the solar module). The elastic portions 410, for example, may be made of a natural or artificial rubber material and can elastically deform to come in contact with the contact surface of the module body. Accordingly, the module body can be effectively fixed even while disassembling is performed. The elastic portions 410, for example, may be made of ring shapes and may protrude from the top surface of the positioning plate 400. The elastic portions 410 may have an appropriate thickness and may be elastically deformed up and down by pressure, and can remove pressure applied to the glass plate by coming in contact with the glass plate (see A1 in FIG. 5) of the module body A' through such elastic deformation. If necessary, besides the elastic portions 410, various structures that can increase friction at the top surface of the positioning plate 400 or can distribute pressure applied to the top surface of the positioning plate 400 may be applied.

The top contact plate 300 is disposed over the positioning plate 400. As shown in FIG. 1, the top contact plate 300 is disposed to face the positioning plate 400 over the positioning plate 400, and comes in contact with the other surface of the module body when the positioning plate 400 is moved up. The surface that the top contact plate 300 comes in contact with is the surface on which the junction box A4 of the module body A' protrudes (the surface on which the film stack is formed), and accordingly, it is the rear surface (i.e., the opposite surface of the light-incident surface) of the solar module. Since the top contact plate 300 and the positioning plate 400 are disposed up and down to face each other, it is possible to firmly fix the module body, that is the internal structure of the solar module, by pressing both top and bottom of the module body. The top contact plate 300 does not overlap the junction box A4 and is spaced apart from the frame A3, whereby it is possible to provide a space for keeping the frame separation blades 100 inside the frame A3 (see FIG. 6). To this end, the top contact plate 300 may be smaller in area than the positioning plate 400 or may be partially cut. Though not shown, if necessary, a structure like the elastic portions may be formed at the lower portion of the top contact plate 300.

The frame separation blades 100 are disposed around the top contact plate 300. As shown in FIG. 2, the frame separation blades 100 can move straight in parallel with the surface of the module body A' between the first position inside the frame A3 and the second side outside the frame A3 (see FIG. 6). The frame separation blades 100 shown in FIG. 2 may be close to each other by retracting as close as possible to the center of the solar module A, which may correspond to the first position of the frame separation blades 100 (i.e., the inside of the frame). The second position of the frame separation blades 100 may be a position where the frame separation blades 100 are moved forward outside the frame A3 in the directions of arrows, respectively, and then stopped. The frame separation blades 100 may have different movement distances and may not be symmetrically moved. However, in any case, the frame separation blades 100 are moved across the frame A3 from the inside to the outside of the frame A3, and necessarily cross the frame A3 surrounding the solar module A within the movement range. Accordingly, the first position may be understood as a position before the frame separation blades 100 cross the frame A3 and the second position may be understood as a position after the frame separation blades 100 cross the frame A3. The first position and the second position may be determined with respect to the frame A3 coupled to the solar module.

As described above, when the positioning plate (see 400 in FIG. 1) moves up and brings the module body A' in contact with the top contact plate 300, the module body A' is pressed and fixed between the positioning plate 400 and the top contact plate 300. In this state, the frame A3 protruding up and down from the edge of the module body A' at least partially crosses the frame separation blades 100. Accordingly, as shown in FIG. 2, when the frame separation blades 100 are moved forward from the inside to the outside of the frame A3, the frame A3 can be pressed and disassembled by the pressure. The frame separation blades 100, for example, may be made of a metallic material having high hardness and may be configured such that pressure is concentrated to the ends. The ends of the frame separation blades 100 may be machined like blades. The frame separation blades 100 may entirely have bar shapes that are parallel with the sides of the frame A3, respectively. However, this is only an example, and the frame separation blades 100 are not necessarily limited thereto and may be changed to other shapes, if necessary.

The pressing actuator 200 is connected to the frame separation blades 100 and provides a driving force to the frame separation blades 100. The pressing actuator 200 includes a plurality of pressing cylinders 210 connected to the frame separation blades 100, respectively, and the plurality of frame separation blades 100 are moved forward from the first position to the second position by the pressing cylinders 210. That is, the frame separation blades 100 are moved from the inside to the outside of the frame A3 coupled to the solar module, whereby the frame A3 is pressed outward from the module body A' and disassembled. As shown in FIG. 2, the plurality of frame separation blades 100 may be disposed in parallel with the sides of the frame A3, respectively, and the plurality of pressing cylinders 210 may be perpendicularly connected to the frame separation blades 100, respectively. The pressing cylinders 210 may be driven by fluid pressure, and channels, a pump, etc. for supplying and returning fluid may be appropriately installed around the pressing cylinders 210. The facility related to supplying and returning fluid is not shown in the figures. The pressing actuator 200, for example, may include a body 201 having a space therein, and the pressing cylinders 210 may be disposed in the body 201. The top surface of the top contact plate 300 may be disposed in the space of the body 201, and the top contact plate 300 and the body 201 may be integrally formed. In this case, the structural strength can be increased.

Since the frame separation blades 100 are moved by contacting and stretching of the pressing cylinders 210, the movement distances of the frame separation blades 100 can be increased and the pressure that is applied to the frame A3 can also be increased in proportion to the strokes of the pressing cylinder 210. Accordingly, it may be required to increase the size of the pressing cylinders 210. Further, since the frame separation blades 100 are perpendicular to the pressing cylinders 210, there is a need for a firmer connection structure that prevents the frame separation blades 100 from twisting. The present disclosure solves this problem by using connection blocks 220. Further, since the junction box separation blade 110 is disposed at some of the frame separation blades 100, structural adjustment may be required. Hereafter, a configuration related to this is described in more detail with reference to FIGS. 3 and 4.

Figure 3:
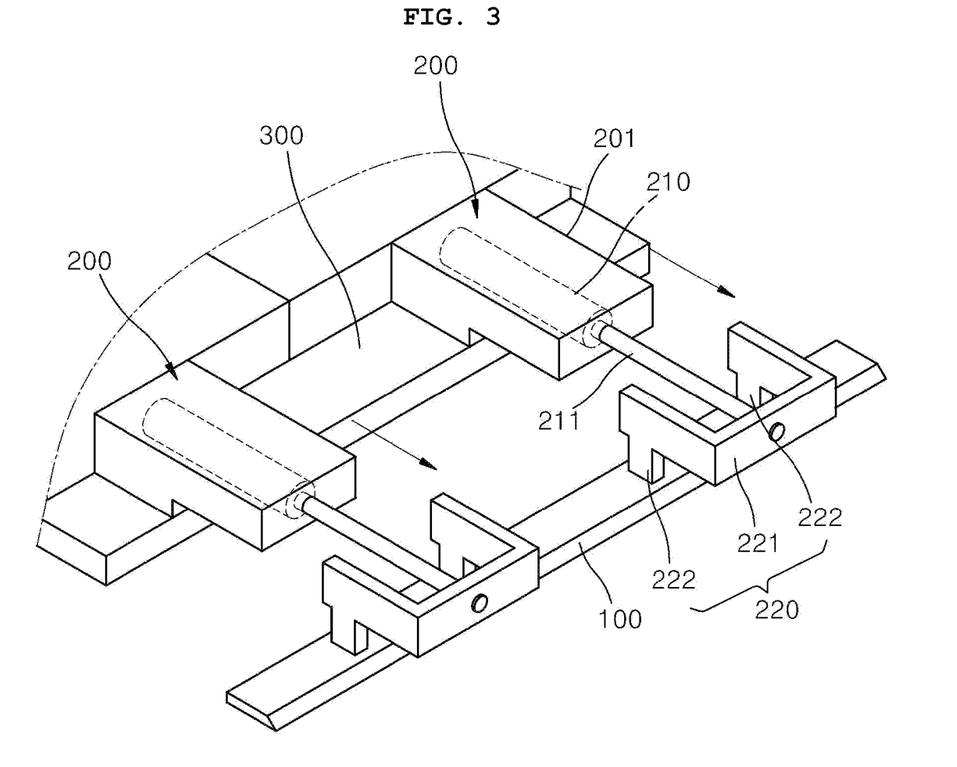
FIG. 3 is an operation view of the frame separation blade of FIG. 2.
Figure 4:
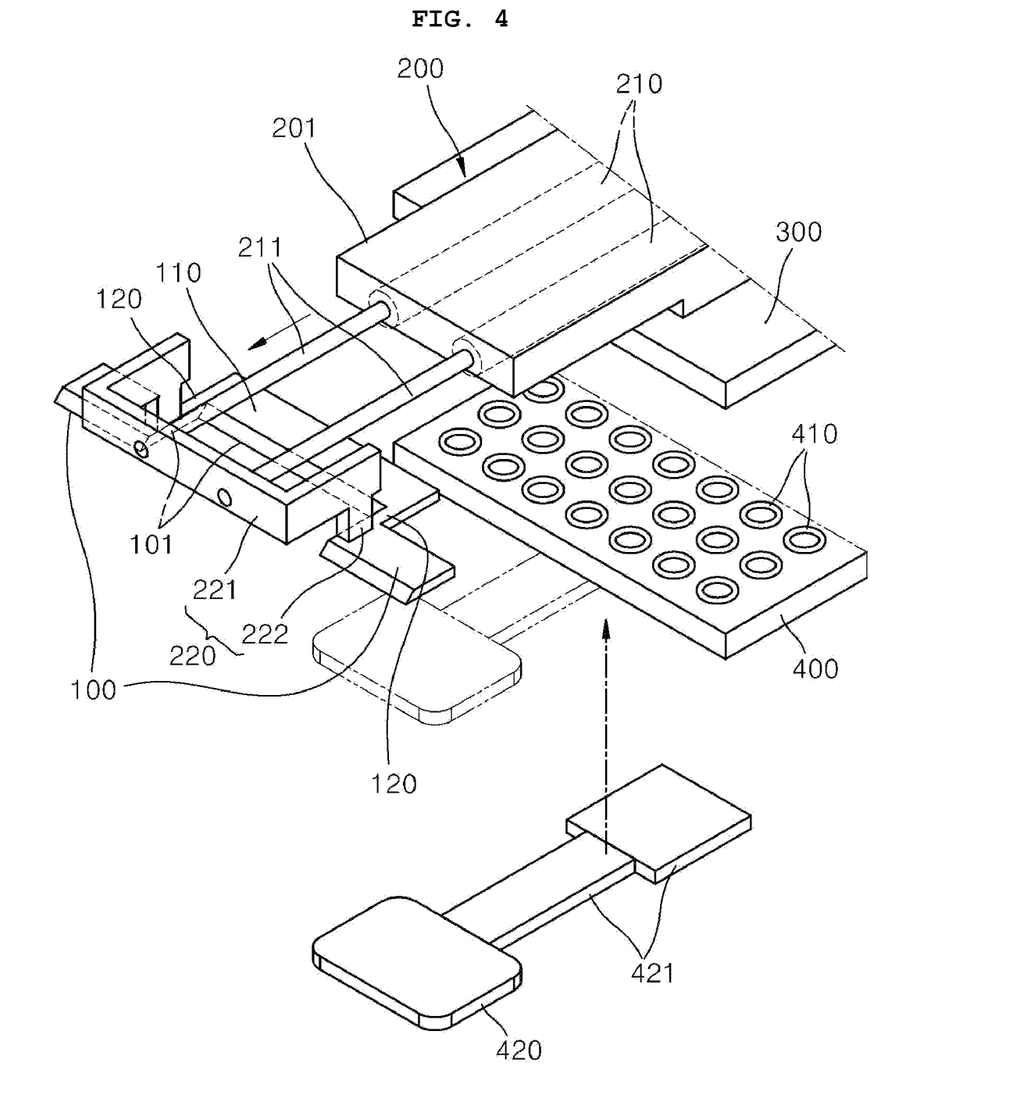
FIG. 4 is an operation view showing a frame separation blade having a junction box separation blade of the frame separation blades of FIG. 2 together with a positioning plate.

FIG. 3 is a view showing the operation of the frame separation blade of FIG. 2 and FIG. 4 is an operation view showing a frame separation blade having a junction box separation blade of the frame separation blades of FIG. 2 together with a positioning plate.

Referring to FIGS. 3 and 4, the frame separation blades 100 may be connected to the pressing cylinders 210 through connection blocks 220, respectively. The connection block 220 includes a head 221 surrounding a piston 211 of the pressing cylinder 210, and a fixing plate 222 protruding from a side of the head 221 and fixing the frame separation blade 100 to the head 221. In particular, the fixing plate 222 is positioned behind the end of the piston 211 in the longitudinal direction of the piston 211, whereby the frame separation blade 100 is positioned further inside than the end of the piston 211. The configuration that the head 221 surrounds the piston 211 may mean that the head 221 at least partially has a portion longitudinally overlapping the piston 211. For example, the center portion of the head 221 may be fixed to the end of the piston 211 and both end portions thereof may longitudinally bend and overlap the piston 211 like a bracket. Although the head 221 is shown in this form in the figures, the head 221 is not necessarily limited thereto and may be changed in various forms.

The fixing plate 222 protrudes from the head 221 and fixes the frame separation blade 100 to the head 221. The fixing plate 222 may be integrated with the head 221 and can fix the frame separation blade 100 by being coupled to the frame separation blade 100 in various ways. The fixing plate 222 and the frame separation blade 100, for example, may be combined through various fastening methods such as welding, thread-fastening, fitting, alone or a combination thereof. For example, when the head 221 has a bracket shape, as described above, the fixing plate 222 may be formed at both ends of the bracket bending in the longitudinal direction of the piston 211. Accordingly, the fixing plate 222 is spaced apart from the end of the piston 211 and positioned behind the piston 211 in the longitudinal direction, thereby being able to fix the frame separation blade 100 at the same position. Such an example is shown in the figures.

As described above, since it is possible to position the frame separation blade 100 behind the end of the piston 211 in the longitudinal direction using the head 221 and the fixing plate 222, it is possible to determine the position of the frame separation blade 100 regardless of the stroke or the length of the piston 211. That is, the frame separation blade 100 is not necessarily positioned further outside than the end of the piston 211 and may be coupled to the connection block 220 and positioned further inside than the piston 211. Accordingly, even if the stroke of the piston 211 of the pressing cylinder 210 is long, it is possible to move the frame separation blade 100 to the inside the frame by adjusting the position of the connection block 220. For example, even if the end of the pressing cylinder 210 (which is the same as the end of the piston) protrudes outside the frame when the pressing cylinder 210 is fully contracted, the frame separation blade 100 can be positioned at the first position inside the frame by appropriately forming the head 221 and the fixing plate 222. Accordingly, it is possible to disassemble the frame by moving the frame separation blade 100 forward to the second position from the first position. By using the connection block 220 in this way, it is possible to freely use a pressing cylinder 210 that is long to be able to apply greater pressure.

A firm connection structure comprised of the fixing plate 222 and the head 221 is also formed between the frame separation blade 100 and the pressing cylinder 210. The head 221 and the fixing plate 222, for example, may be an integrated metallic structure, and the end of the piston 211 may be firmly fixed by being tightened by a screw, etc. after passing through the head 221. Since the fixing plate 222 is coupled to the frame separation blade 100 by welding, etc., the connection structure can have strength sufficient to prevent twisting, etc. of the frame separation blade 100. As shown in the figures, a plurality of pressing cylinders 210 are connected in parallel to one frame separation blade 100 and at least two supporting points are secured to support the frame separation blade 100, whereby it is possible to prevent twisting of the frame separation blade 100 and increase the structural strength. Accordingly, it is possible to press one side of the frame with a plurality of pressing cylinders 210, which is advantageous in increasing pressure.

The junction box separation blade 110 is disposed on at least any one of the frame separation blades 100. The structure of the junction box separation blade 110 is shown in FIG. 4. The junction box separation blade 110 may be formed by deforming a portion of the frame separation blade 100 and may be formed by moving a portion of the frame separation blade 100 rearward (i.e., toward the second position from the first position). In FIGS. 3 and 4, the frame separation blades 100 may be moved forward and positioned at the second position, and the arrows at sides of the pistons 211 indicate the forward movement direction of the frame separation blades 100. The junction box separation blade 110, as shown in the figures, may be formed by moving rearward a portion of the frame separation blade 100. A connection wall 120 fixing the junction box separation blade 110 moved rearward from the frame separation blade 100 is formed between the junction box separation blade 110 and the frame separation blade 100.

Since the junction box separation blade 110 is connected to the frame separation blade 100 by the connection wall 120, when the frame separation blade 100 is moved, the junction box separation blade 110 is also moved with the frame separation blade 100. However, since the junction box separation blade 110 is positioned further rearward than the frame separation blade 100, they press different points even though they are moved together. That is, when the frame separation blade 100 comes in contact with the frame, the junction box separation blade 110 comes in contact with the junction box behind the frame separation blade 100. Further, when the frame separation blade 100 presses the frame to disassemble the frame, the junction box separation blade 110 presses the junction box to disassemble the junction box behind the frame separation blade 100. Accordingly, it is possible to simultaneously remove the frame and the junction box. The gap between the junction box separation blade 110 and the frame separation blade 100 can be adjusted by adjusting the length of the connection wall 120, whereby the junction box separation blade 110 can be appropriately disposed. The appropriate disposition may be the state in which when the frame separation blade 100 comes in contact with the frame, the junction box separation blade 110 comes in contact with the junction box. The appropriate disposition may be determined in consideration of the size, etc. of the junction box.

A junction box disassembling groove 101 for retaining the junction box therein is formed inside the junction box separation blade 110 and the connection wall 120. As shown in FIG. 4, the junction box disassembling groove 101 is surrounded and closed by the junction box separation blade 110 and the connection wall 120 with the front open. Accordingly, the junction box can be retained therein. The junction box disassembling groove 101 retains the junction box to be in contact with the junction box disassembling groove 101, so the junction box is more easily disassembled. The junction box disassembling groove 101 may be modified, if necessary. For example, the connection wall 120 may be tapered such that the width of the junction box disassembling groove 101 gradually decreases toward the junction box separation blade 110. In addition, when the junction box has a curved surface, etc., the junction box disassembling groove 101 may be modified to correspond to the junction box. Accordingly, it is possible to easily retain the junction box in the junction box disassembling groove 101 and can easily remove the junction box by pressing the junction box with the junction box separation blade 110 around the junction box.

An increase of load that is generated by pressure concentration when the junction box is disassembled can be supported by an outer supporting plate 420, etc. For example, the outer supporting plate 420 may be coupled to the positioning plate 400 and may extend from the positioning plate 400 toward the junction box, thereby being able to support the bottom (or the surrounding) of the junction box. The outer supporting plate 420 may have a connecting portion 421 extending toward the positioning plate 400, and the connecting portion 421 may be separably coupled to the positioning plate 400. Accordingly, if necessary, it is possible to separate and use the entire of the outer supporting plate 420 and the connecting portion 421. The positioning plate 400 comes in contact with the module body as described above, so the width or area may be smaller than the width or area of the entire module body. Accordingly, the outer supporting plate 420 may be disposed to deal with load concentrated to the bottom of the junction box when the junction box is disassembled. However, when the junction box is easily removed even by small pressure, the load may be relatively small, so in this case, disassembling may be performed without using the outer supporting plate 420.

Figure 5:
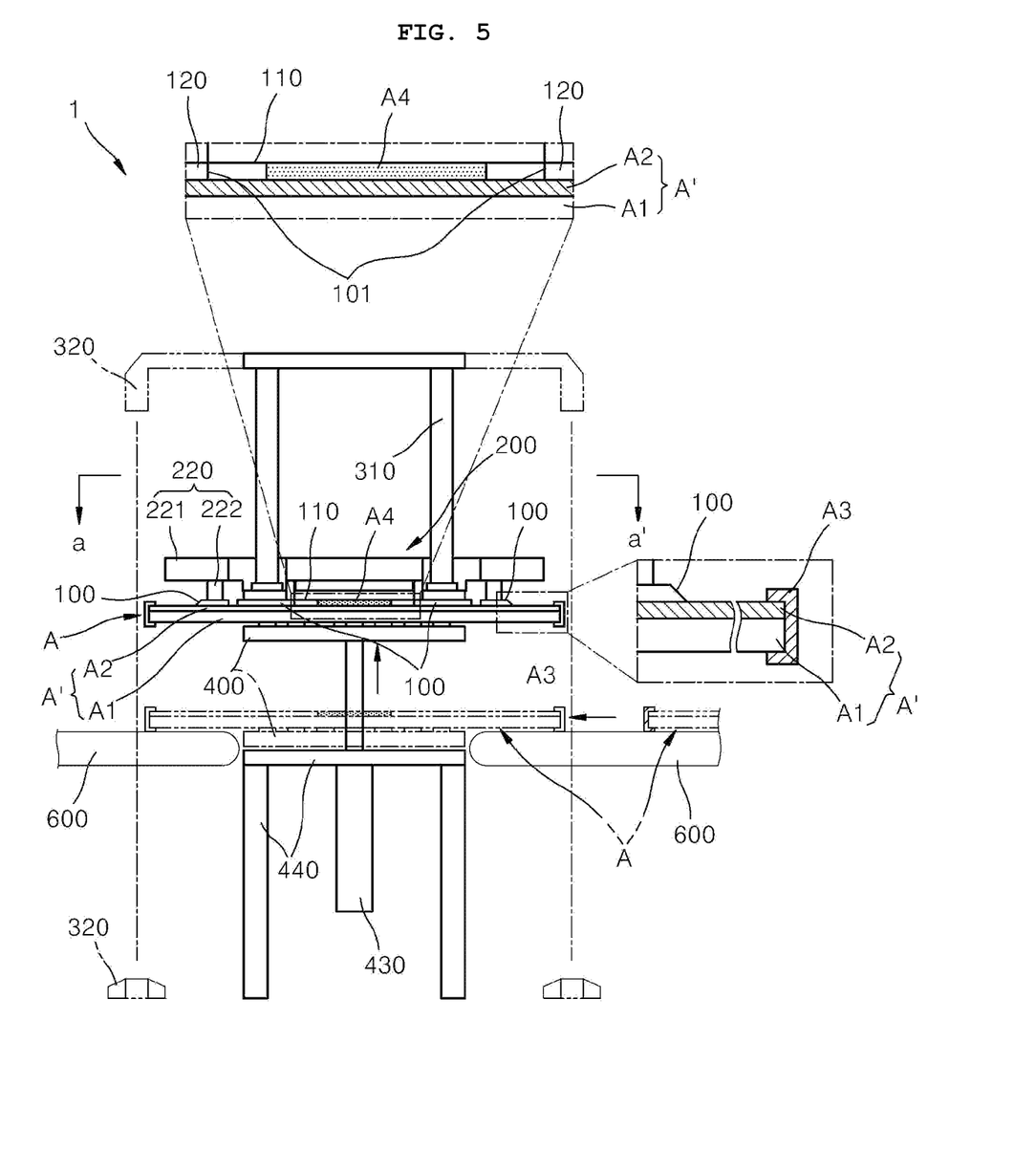
FIG. 5 is a view showing an operation of adjusting the position of a solar module by the solar module exterior disassembling apparatus of FIG. 1.
Figure 6:
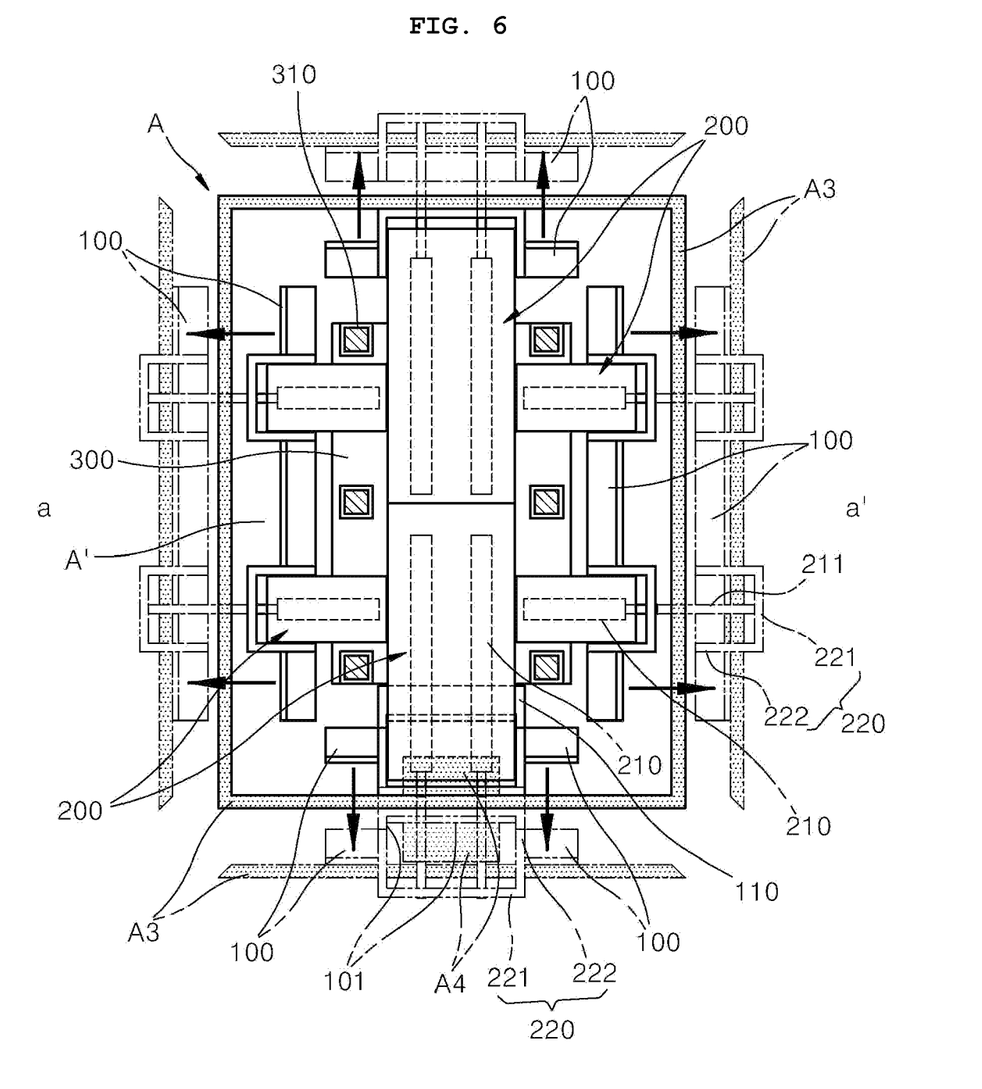
FIG. 6 is a view showing an operation of disassembling a solar module by the solar module exterior disassembling apparatus of FIG. 5.

FIG. 5 is a view showing an operation of adjusting the position of a solar module by the solar module exterior disassembling apparatus of FIG. 1, and FIG. 6 is a view showing an operation of disassembling a solar module by the solar module exterior disassembling apparatus of FIG. 5. FIG. 5 shows the front of the solar module exterior disassembling apparatus shown in FIG. 1, in which a cross-section of the solar module is shown to show the internal structure. FIG. 6 shows the cross-section taken along line a-a' of FIG. 5 with the rail 600 omitted.

Hereafter, the operation of the solar module exterior disassembling apparatus 1 is described in more detail with reference to FIGS. 5 and 6.

Referring to FIG. 5, the solar module exterior disassembling apparatus 1 can disassemble a solar module A while being automatically supplied with the solar module A through the rail 600. The rail 600 may be installed at an appropriate position, and for example, may be disposed with the end facing the top of the base 440. The height of the rail 600 may be matched to the height of the top of the positioning plate 400 when moved down. The rail 600 may be comprised of a rail 600 for being supplied with a solar module A (which may be the rail at the right side in FIG. 5), a rail 600 for discharging the module body A' after the frame A3 is disassembled (which may be the rail at the left side in FIG. 5), etc. The rail 600, for example, may include a conveying structure such as a roller, a belt, etc. that can covey the solar module A.

The supplied solar module A is placed on the positioning plate 400, and the positioning plate 400 lifts the solar module A. Accordingly, the solar module A is lifted to come in contact with the upper structure, as shown in FIG. 5. As shown in FIG. 6, since the top contact plate 300 is disposed over the positioning plate 400, the module body A', that is the internal structure of the solar module A, is fixed in close contact between the positioning plate 400 and the top contact plate 300. In this process, the frame separation blades 100 disposed around the top contact plate 300 also come in contact with the module body A', and as shown in FIG. 5, at least partially cross the frame A3 surrounding the module body A'. In this state shown in FIG. 5, all of frame separation blades 100 are at the first position inside the frame A3.

Here, the junction box A4 protruding from the top surface of the module body A' is inserted in or positioned at least ahead of the junction box disassembling groove 101. Since the junction box separation blade 110 is disposed at the side crossing the junction box A4 of the frame separation blade 100, the junction box disassembling groove 101 defined by the junction box separation blade 110 and the connection wall 120 is also disposed at the side corresponding to the junction box A4. The positions of the junction box separation blade 110 and the junction box disassembling groove 101 may be determined in accordance with the alignment direction of the solar module A (see FIG. 2). Alternatively, it is also possible to appropriately adjust the alignment direction of the solar module A and supply the solar module while checking the positions of the junction box separation blade 110 and the junction box disassembling groove 101. The solar module A is lifted and the position before disassembling is adjusted in this way.

In this process, pressure may be applied downward to the top contact plate 300 and this pressure can be supported by a supporting structure such as upper columns 310. That is, upper columns 310 may be perpendicularly connected to the top surface of the top contact plate 300 to support the pressure applied downward to the top contact plate 300 at the upper side. The lower ends of the upper columns 310 may be connected to the top contact plate 300 and the upper ends thereof may be connected to an upper supporting body 320 providing a supporting force. The upper supporting body 320 may be supported on the ground, and the structure or the shape is not necessarily specifically limited, so it is briefly shown with the detailed structure, etc. omitted. The upper supporting body 320 may be formed in various shapes that can support the upper structure including the top contact plate 300, the pressing actuator 200 disposed over the top contact plate 300, and the frame separation blades 200 connected to the pressing actuator 200. Although the upper supporting body 320 is supported on the ground in the figures, if necessary, the upper supporting body 320 may be supported on the ceiling of a workspace.

When the solar module A is fixed, as shown in FIG. 5, the frame separation blades 100 are immediately moved and disassemble the frame A3, as shown in FIG. 6. The frame separation blades 100, as described above, are operated by the pressing actuator 200. When the pressing cylinders 210 of the pressing actuator 200 stretch, the frame separation blades 100 are moved forward from the first position inside the frame A3 to the second position outside the frame A3 (see the arrows in FIG. 6). Accordingly, as shown in FIG. 6, the frame A3 can be pressed outward from the module body A' and disassembled. The frame A3, for example, may be formed by connecting a plurality of metal (may be aluminum, etc.) bars to each other, and the frame separation blades 100 may perpendicularly press the sides of the frame A3, respectively. Accordingly, the frame A3, for example, can be disassembled as the joints are separated from each other by pressure. The frame A3 is separated from the module body A' in this way.

In this process, the junction box A4 is retained in the junction box disassembling groove 101, as described above, and is disassembled by the pressure applied from the junction box separation blade 110. That is, as described above, the frame separation blades 100 and the junction box separation blade 110 are connected and moved together, thereby simultaneously disassembling the frame A3 and the junction box A4. Since the junction box A4 is a relatively small box, it can be inserted in the junction box disassembling groove 101 to prevent unnecessary movement and be stably disassembled. In this way, the exterior including the frame A3 and the junction box A4 can be simultaneously disassembled from the solar module A. After the frame A3 and the junction box A4 are separated, the remaining module body A' is placed on the rail, etc. by descending of the positioning plate 400 and then discharged from the positioning plate 400, whereby it can be put into the next process. As described above, it is possible to disassemble a solar module A using the solar module exterior disassembling apparatus 1 of the present disclosure.

Hereafter, another embodiment of the present disclosure is described in detail with reference to FIGS. 7 to 10. For simple and clear description, the difference from the previous embodiment will be mainly described, and other configurations may refer to the previous description.

Figure 7:
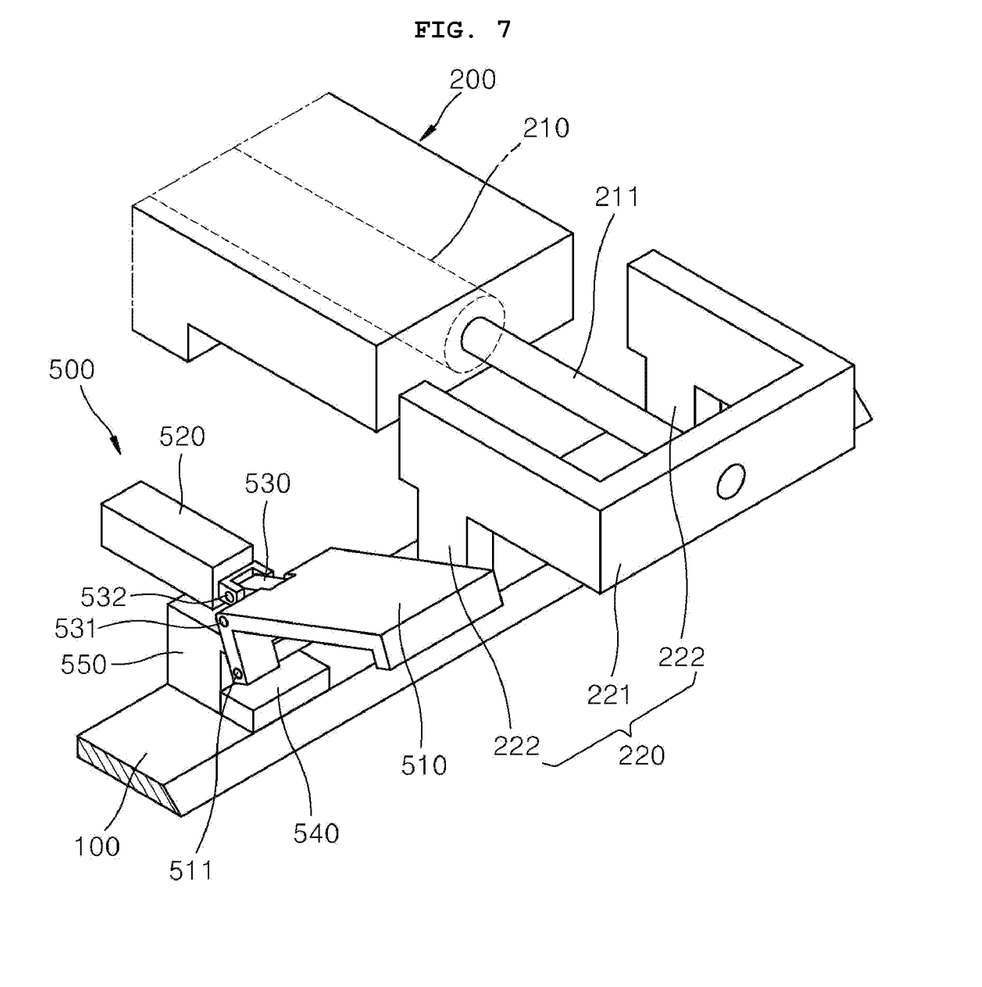
FIG. 7 is a perspective view showing a gripper of a solar module exterior disassembling apparatus according to another embodiment of the present disclosure.

FIG. 7 is a perspective view showing a gripper of a solar module exterior disassembling apparatus according to another embodiment of the present disclosure.

Referring to FIG. 7, a solar module exterior disassembling apparatus according to another embodiment of the present disclosure may further include a gripper 500 coupled to the frame separation blade 100. Other configurations are substantially the same as those of the above embodiment, so the description thereof is omitted. The gripper 500 may include a movable claw 510 coupled to the frame separation blade 100 and holding and bringing the frame of a solar module in contact with the frame separation blade 100 (see FIG. 9). The movable claw 510 can be folded or unfolded, and for example, may be rotated about a shaft. The movable claw 510 is coupled at an end to a shaft 511 fixed to the frame separation blade 100, so it can be folded or unfolded by rotating about the shaft 511. The movable claw 510 may be in an unfolded state in FIG. 7, and when the movable claw 510 is folded by rotating about the shaft 511, a frame can be retained between the frame separation blade 100 and the movable claw 510.

The shaft 511, for example, may be installed at a fixed structure that is fixed to the frame separation blade 100 such as a stand 550. An end of the movable claw 510 may be rotatably coupled to the shaft 511 and another end may be bent. The movable claw 510 may have a hinge shaft 531 spaced apart from the shaft 511 at a side, and can be supplied with a driving force through the hinge shaft 531. An operation cylinder 520 that is operated by fluid pressure may be connected to the hinge shaft 531, and the movable claw 510 can be operated by the operation of the operation cylinder 520. Though not shown, a channel for flow of fluid may be formed at a side of the operation cylinder 520, and a pump, etc. connected to the channel may be disposed at appropriate positions.

The structure of the gripper 500 is described in more detail hereafter. The gripper 500 may include a sensor unit 540 that senses the frame at a side of the frame separation blade 100 and generates a sensing signal, and the operation cylinder 520 spaced apart from the shaft 511, coupled to the hinge shaft 531 disposed at the movable claw 510, and driving the movable claw 510 by pushing or pulling the hinge shaft 531 using fluid pressure in response to a sensing signal. Accordingly, the gripper 500 can automatically hold a frame on the basis of the sensing operation of the sensor unit 540. The operation cylinder 520 includes a piston that contracts and stretches and has a connection link 530 formed at the end of the piston 530, whereby it can be coupled to the hinge shaft 531. The connection link 530 has an end coupled to the hinge shaft 531 and the other end coupled to the connection shaft 532 at the end of the piston, thereby being able to function as a type of joint connecting the operation cylinder 520 and the movable claw 510.

The sensor unit 540 may include a contact sensor that senses a contact by an object, and if necessary, may include other sensors such as a proximity sensor that senses objects approaching within a predetermined range. The sensor unit 540 may be configured in various manners that can sense a frame. The sensor unit 540, for example, may be electrically connected to a controller that controls the operation cylinder 520 (e.g., a control structure including an electric control type pump that adjusts hydraulic pressure), thereby being able to automatically operate the operation cylinder 520. According to this configuration, it is possible to hold, fix, and more safely disassemble a frame as follows.

Figure 8:
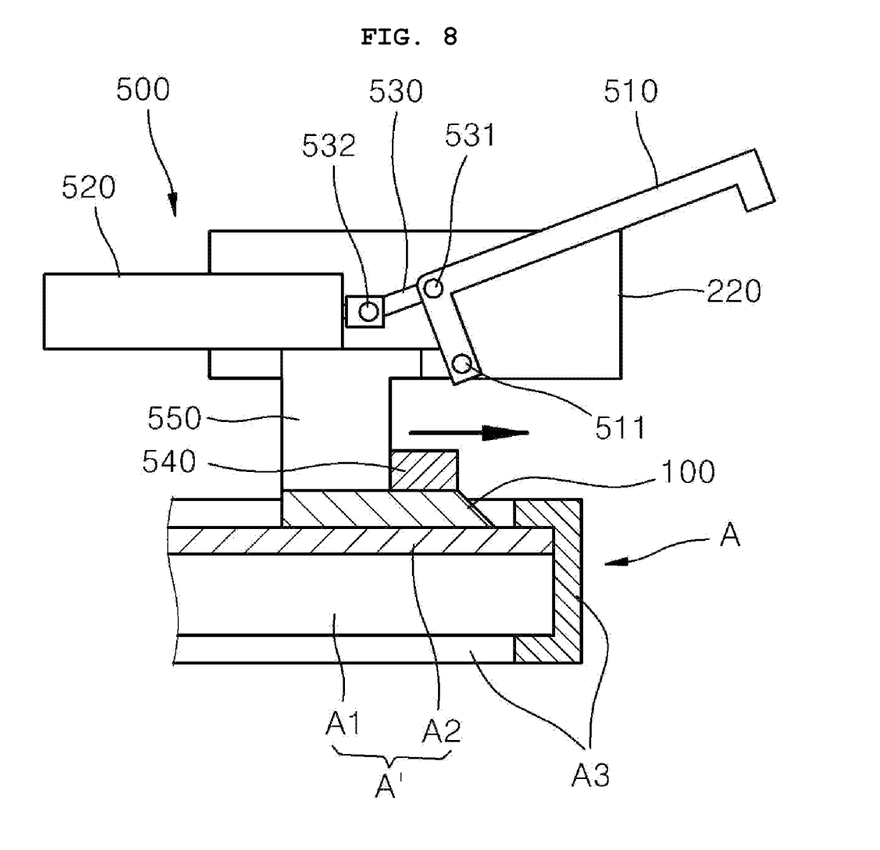
FIGS. 8 and 9 are operation views showing the operation of the gripper of FIG. 7.
Figure 9:
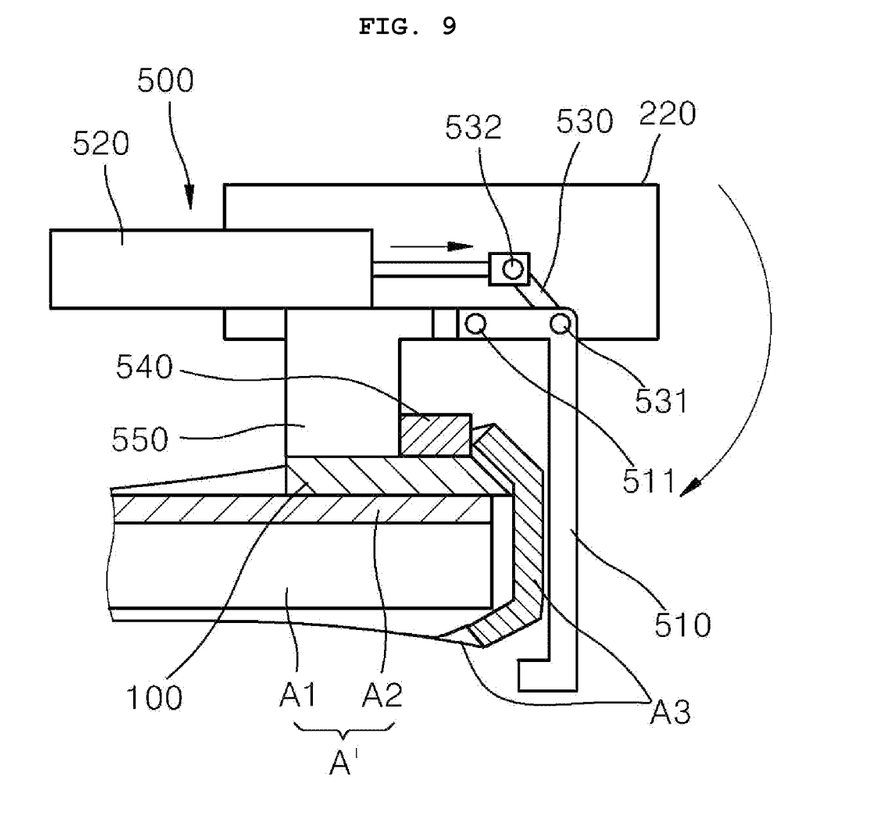
Figure 10:
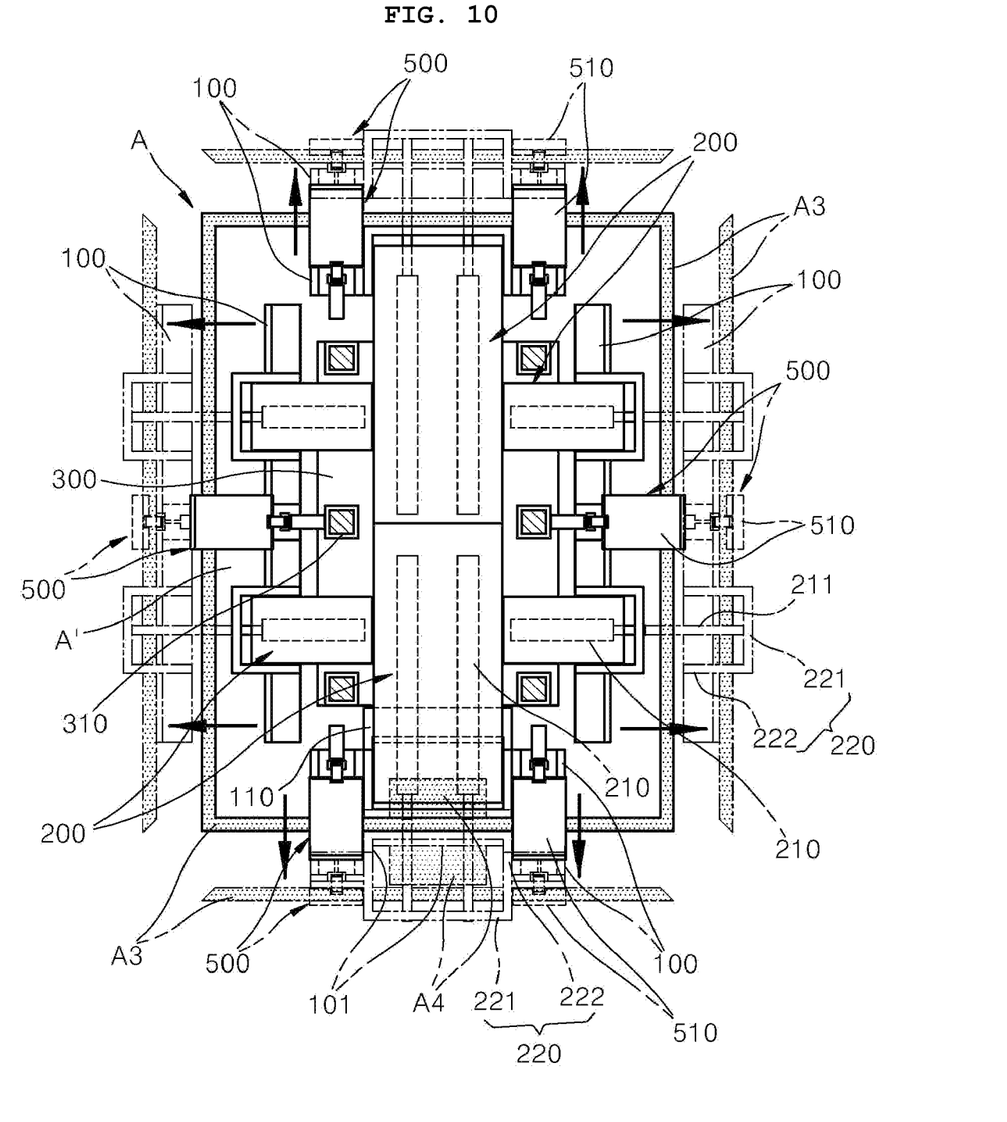
FIG. 10 is a view showing an operation of disassembling a solar module by the solar module exterior disassembling apparatus according to another embodiment of the present disclosure.

FIGS. 8 and 9 are operation views showing the operation of the gripper of FIG. 7, and FIG. 10 is a view showing an operation of disassembling a solar module by the solar module exterior disassembling apparatus according to another embodiment of the present disclosure. FIG. 10 shows the solar module exterior disassembling apparatus with grippers coupled to frame separation blades in the direction of FIG. 6.

The gripper may be maintained in the state shown in FIG. 8 before the sensor unit 540 senses the frame A3. That is, the operation cylinder 520 contracts and pulls the hinge shaft 531, and accordingly, the movable claw 510 is maintained in the unfolded state. Even though the frame separation blade 100 equipped with the gripper 500 is moved, the gripper 500 is maintained in the state unless the frame A3 is sensed. However, as shown in FIG. 9, when the sensor unit 540 senses the adjacent frame A3 by a contact, etc., the operation cylinder 520 pushes the hinge shaft 531, thereby quickly rotating the movable claw 510. Accordingly, the movable claw 510 folds and holds the frame A3 and the frame A3 is retained between the frame separation blade 100 and the movable claw 510. Accordingly, it is possible effectively prevent an accident that the frame A3 is flown outside due to pressure applied by the frame separation blade 100. When the module body A' is separated from the frame A3, the movable claw 510 can further fold because the rotation range increases, so it can more strongly fix the frame A3.

In this case, the connection link 530, which is a kind of double joint structure including the hinge shaft 531 and the connection shaft 532, can smoothly change the straight motion of the piston into a rotational motion of the movable claw 510. The shape of the movable claw 510 is not limited, and the movable claw 510 can be freely changed into any shapes other than that in the figures. If necessary, it is possible to more firmly fix the frame A3 by appropriately changing the degree of bending of the end, the shape, the entire length, etc. The grippers 500, as shown in FIG. 10, may be coupled to a plurality of different frame separation blades 100, respectively. Accordingly, it is possible to hold and fix a plurality of separated frames A3 using the grippers 500. Accordingly, even if greater pressure is applied by a pressing cylinder 210 having a relatively long stroke, disassembling can be very safely performed. The number of the gripper 500 disposed at the frame separation blade 100 may be decreased or increased, if necessary, and the positions of the grippers 500 can also be freely changed, so it is possible to more safely perform disassembling by appropriately installing the grippers 500.

According to the present disclosure, it is possible to conveniently perform, particularly, a work of disassembling an exterior (a frame, a junction box, etc.) that is a preceding process of the processes for discarding a solar module. According to the present disclosure, it is possible to simply and effectively disassemble the frame of a solar module and it is also possible to simultaneously disassemble the frame and a junction box, that is another exterior, through a single process. According to the present disclosure, there is an advantage that it is possible to disassemble a frame by pressing the frame, yet smoothly perform disassembling by firmly fixing the frame and other parts that are separated from the frame. Further, since the frame is fixed in disassembling, it is possible to effectively prevent a safety accident that a metallic frame flies due to the elasticity thereof.

Although exemplary embodiments of the present disclosure were described above with reference to the accompanying drawings, those skilled in the art would understand that the present disclosure may be implemented in various ways without changing the necessary features or the spirit of the prevent disclosure. Therefore, the embodiments described above are only examples and should not be construed as being limitative in all respects.

What is claimed is:

1. A solar module exterior disassembling apparatus for disassembling an exterior of a solar module in which a plate-shaped module body, which is comprised of a glass plate and a film stack including solar cells stacked on the glass plate, and the exterior, which includes a frame surrounding an edge of the module body and a junction box attached to and protruding from an outer surface of the film stack, are coupled, the solar cell exterior disassembling apparatus comprising:

a positioning plate supporting one surface of the module body from below the solar module and being able to move up and down;

a top contact plate disposed to face the positioning plate over the positioning plate and coming in contact with another surface of the module body when the positioning plate is moved up;

a plurality of frame separation blades disposed around the top contact plate and moving in parallel with a surface of the module body between a first position inside the frame and a second position outside the frame;

a pressing actuator including a plurality of pressing cylinders and pressing outward from the module body and disassembling the module body by moving forward the frame separation blades from the first position to the second position with the pressing cylinders; and a junction box separation blade disposed on any one of the frame separation blades and formed by moving rearward a portion of the frame separation blade.

2. The apparatus of claim 1, further comprising a connection wall fixing the junction box separation blade behind the frame separation blade.

3. The apparatus of claim 2, further comprising a junction box disassembling groove surrounded and closed by the junction box separation blade and the connection wall with a front thereof open to retain the junction box therein.

4. The apparatus of claim 1, further comprising upper columns perpendicularly connected to a top surface of the top contact plate and supporting pressure applied downward to the top contact plate from above.

5. The apparatus of claim 1, wherein the frame separation blades are disposed in parallel with sides of the frame, respectively, and the pressing cylinders are perpendicularly connected to the frame separation blades, respectively.

6. A solar module exterior disassembling apparatus for disassembling an exterior of a solar module in which a plate-shaped module body, which is comprised of a glass plate and a film stack including solar cells stacked on the glass plate, and the exterior, which includes a frame surrounding an edge of the module body and a junction box attached to and protruding from an outer surface of the film stack, are coupled, the solar cell exterior disassembling apparatus comprising:
a positioning plate supporting one surface of the module body from below the solar module and being able to move up and down;
a top contact plate disposed to face the positioning plate over the positioning plate and coming in contact with another surface of the module body when the positioning plate is moved up;
a plurality of frame separation blades disposed around the top contact plate and moving in parallel with a surface of the module body between a first position inside the frame and a second position outside the frame;
a pressing actuator including a plurality of pressing cylinders and pressing outward from the module body and disassembling the module body by moving forward the frame separation blades from the first position to the second position with the pressing cylinders; and
a gripper including a movable claw coupled to at least one of the frame separation blades and holding and bringing the frame in contact with the at least one of the frame separation blades.

7. The apparatus of claim 6, wherein the movable claw is coupled at an end to a shaft fixed to the at least one of the frame separation blades, so the movable claw can be folded or unfolded by rotating about the shaft.

8. The apparatus of claim 7, wherein the gripper comprises:
a sensor unit sensing the frame at a side of the at least one of the frame separation blades and generating a sensing signal; and
an operation cylinder spaced apart from the shaft, coupled to a hinge shaft disposed at the movable claw, and driving the movable claw by pushing or pulling the hinge shaft using fluid pressure in response to the sensing signal.

9. A solar module exterior disassembling apparatus for disassembling an exterior of a solar module in which a plate-shaped module body, which is comprised of a glass plate and a film stack including solar cells stacked on the glass plate, and the exterior, which includes a frame surrounding an edge of the module body and a junction box attached to and protruding from an outer surface of the film stack, are coupled, the solar cell exterior disassembling apparatus comprising:
a positioning plate supporting one surface of the module body from below the solar module and being able to move up and down;
a top contact plate disposed to face the positioning plate over the positioning plate and coming in contact with another surface of the module body when the positioning plate is moved up;
a plurality of frame separation blades disposed around the top contact plate and moving in parallel with a surface of the module body between a first position inside the frame and a second position outside the frame;
a pressing actuator including a plurality of pressing cylinders and pressing outward from the module body and disassembling the module body by moving forward the frame separation blades from the first position to the second position with the pressing cylinders;
upper columns perpendicularly connected to a top surface of the top contact plate and supporting pressure applied downward to the top contact plate from above; and
a head surrounding and coupled to a piston of at least one of the pressing cylinders and a connection block protruding from a side of the head and having a fixing plate fixing at least one of the frame separation blades to the head,
wherein the fixing plate is positioned behind an end of the piston in the longitudinal direction of the piston,
wherein the frame separation blades are disposed in parallel with sides of the frame, respectively, and the pressing cylinders are perpendicularly connected to the frame separation blades, respectively.

* * * * *